United States Patent
Bellemore et al.

(10) Patent No.: US 6,804,693 B2
(45) Date of Patent: *Oct. 12, 2004

(54) METHOD FOR REDUCING SKEW IN A REAL-TIME CENTROID CALCULATION

(75) Inventors: David G. Bellemore, Fairfield, CT (US); David R. Fournier, Hudson, MA (US); Michael A. Davis, Glastonbury, CT (US)

(73) Assignee: CiDRA Corporation, Wallingford, CT (US)

( * ) Notice: Subject to any disclaimer, the term of this patent is extended or adjusted under 35 U.S.C. 154(b) by 598 days.

This patent is subject to a terminal disclaimer.

(21) Appl. No.: 09/929,423

(22) Filed: Aug. 14, 2001

(65) Prior Publication Data

US 2003/0041079 A1 Feb. 27, 2003

(51) Int. Cl.[7] .................................................. G06F 7/00
(52) U.S. Cl. ....................................... 708/207; 702/66
(58) Field of Search ................................ 708/207, 317; 702/66, 73; 327/58–62

(56) References Cited

U.S. PATENT DOCUMENTS

| | | | | |
|---|---|---|---|---|
| 5,274,569 A | * | 12/1993 | Prasad | 702/66 |
| 5,825,670 A | | 10/1998 | Chernoff et al. | |
| 5,987,392 A | * | 11/1999 | Tucker et al. | 702/66 |
| 6,115,675 A | | 9/2000 | Benco et al. | |
| 6,201,909 B1 | | 3/2001 | Kewitsch et al. | |
| 6,233,373 B1 | | 5/2001 | Askins et al. | |
| 6,445,756 B1 | * | 9/2002 | Takahashi | 375/343 |
| 2001/0011289 A1 | | 8/2001 | Bellemore et al. | |

OTHER PUBLICATIONS

U.S. patent application Ser. No. 09/087,447, Davis et al, filed May 29, 1998.

* cited by examiner

Primary Examiner—Chuong Dinh Ngo
(74) Attorney, Agent, or Firm—Ware, Fressola, Van Der Sluys & Adolphson LLP

(57) ABSTRACT

A method and corresponding apparatus for determining the centroid ($V_c$) of a waveform signal being sampled at a set of parameter values ($V_i$, i=1, ..., n) yielding a corresponding set of sampled amplitudes ($A_i$, i=1, ..., n), each parameter value and corresponding amplitude forming a sampled point ($V_i$, $A_i$), the method including the steps of: selecting an amplitude at which to create an interpolated point; interpolating a first parameter value corresponding to the amplitude selected in the step of selecting an amplitude; and performing a centroid calculation using only the sampled points with an amplitude greater than a predetermined threshold. The waveform is sometimes sampled in the presence of background noise, and the method sometimes also includes: estimating the background ($B_i$) for each value in the set of parameter values at which sampling is performed; and reducing the amplitude ($A_i$) of each sampled amplitude by the background ($B_i$) so estimated.

10 Claims, 3 Drawing Sheets

METHOD FOR REDUCING SKEW IN A REAL-TIME CENTROID CALCULATION

FIELD OF THE INVENTION

The present invention relates to real-time signal processing, and more particularly to the real-time determination of a center value (centroid) of a waveform.

BACKGROUND OF THE INVENTION

Often it is necessary to determine precisely a center value of a waveform, such as the wavelength value at which a peak of a waveform occurs in a signal representing light energy over a range of wavelengths, and to do so in a way that involves a small computational burden, so as to perform the calculation in "real-time" (i.e. performing the calculation at a rate sufficient to keep pace with the arrival of each new set of calculation inputs). For example, in many situations, it is necessary to determined the center value of a waveform in a signal of light reflected from a Bragg grating inscribed in an optical fiber. An optical fiber in which a Bragg grating is inscribed can be used as a component of a pressure sensor or as a component of an optical add/drop multiplexer. The wavelength of the light reflected by the Bragg grating (i.e. the center value of the peak in a signal corresponding to the reflected light) conveys information of use in the sensor and add/drop multiplexer applications.

The precision required for different applications varies, but a precision of better than 1 part in 300 of the full width at half maximum (FWHM) of a waveform is often required. A simple technique to determine the center of a waveform (i.e. e.g. the position of a peak in the waveform) uses a centroid (or center of mass) calculation over an area of interest. For an evenly sampled waveform having n sampled points, the basic equation for the calculation of the centroid of the waveform is:

$$V_c = \frac{\sum_{i=1}^{n} V_i A_i}{\sum_{i=1}^{n} A_i} \quad (1)$$

where $A_i$ is the sampled amplitude at wavelength $V_i$ (or some other parameter, besides wavelength). As seen in equation (1), each sample point is weighted by the amplitude at the sample point.

A centroid calculation according to equation (1) can be performed quickly is therefore useful as a real-time computer algorithm. Equation (1) can be used for example to determine the center wavelength $V_c$ of a waveform where n measurements $A_i$ of power level are taken at n different wavelengths $V_i$.

The number n of sampled points in the calculation is critical when using equation (1). Ideally, the samples span the entire waveform of interest. However, in practical applications this is not always possible due to factors such as sampling rates and memory requirements. When the samples do not span the entire waveform, a fixed number of sample points around the peak value of a waveform are used. However, the locations of the sampled points affect the determination of the waveform center, especially when the points are not perfectly symmetric about the actual waveform peak.

In a typical real-time application in which a centroid is determined, only a small number of sampled points of a waveform are available from which to determine the centroid of the waveform, sometimes as few as seven points and sometimes even fewer. Even with such a small number of sampled points however, if the sampled points are symmetric with respect to the true centroid, the calculation according to equation (1) will provide the true centroid. On the other hand, if the sampled points are unevenly distributed with respect to the true centroid, the calculation according to equation (1) will in general be skewed. (The use of equation (1) for some uneven distributions could still yield the correct centroid, as long as the sum of the moment arms (amplitude times wavelength) on one side of the true centroid balances the corresponding sum on the other side.)

A co-pending, co-owned application serial number 087447, filed May 29, 1998, entitled METHOD FOR IMPROVING THE ACCURACY IN THE DETERMINATION OF A WAVEFORM CENTER, discloses a method of correcting for skew in a calculation of a centroid of a waveform based on eliminating some of the sample points used in the calculation according to equation (1). In some situations, especially when the number of sample points is already a very small number, ignoring some of the sample points tends to increase error in the calculation of the centroid.

What is needed is a method for reducing skew in the calculation of the centroid of a waveform not based on only eliminating any of the sampled points, but rather based on adding points to be used in the calculation of the centroid.

SUMMARY OF THE INVENTION

Accordingly, the present invention provides a method and corresponding apparatus for determining the centroid ($V_c$) of a waveform signal indicating how the output of a system, such as the light reflected by a Bragg grating inscribed in an optical fiber, responds to an input signal, such as incident light, as the value of a characteristic of the input signal, such as the wavelength of the incident light, is varied over a predetermined range, the waveform being sampled at a set of parameter values ($V_i$, i=1, . . . , n) yielding a corresponding set of sampled amplitudes ($A_i$, i=1, . . . , n), each parameter value and corresponding amplitude forming a sampled point ($V_i$, $A_i$), the method including the steps of: selecting an amplitude at which to create an interpolated point; interpolating a first parameter value corresponding to the amplitude selected in the step of selecting an amplitude; and performing a centroid calculation using only the sampled points with an amplitude greater than a predetermined threshold.

In a further aspect of the invention, the amplitude selected in the step of selecting an amplitude is less than approximately twenty percent of the maximum sampled amplitude.

In another further aspect of the invention, the centroid ($V_c$) is calculated using as a formula:

$$V_c = \frac{\sum_{i=1}^{n} V_i A_i}{\sum_{i=1}^{n} A_i}.$$

In yet another further aspect of the invention, the waveform is sampled in the presence of background noise, and the method also includes the steps of: estimating the background ($B_i$) for each value in the set of parameter values at which sampling is performed; and reducing the amplitude ($A_i$) of each sampled amplitude by the background ($B_i$) so estimated.

In still yet another further aspect of the invention, there is, among the sampled amplitudes, a maximum sampled amplitude, and, in addition, the method also includes the step of interpolating a second parameter value to correspond to the amplitude selected in the step of selecting an amplitude, the second value on the opposite side from the first interpolated value of the maximum sampled amplitude.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

In order to reduce skew in a real-time calculation of the centroid $V_c$ of a waveform sampled at a set of wavelengths $V_i$ (or some other physical parameters on which the waveform depends) and so observed to have corresponding amplitudes $A_i$, the present invention involves adding to the set of sample points (wavelength-amplitude pairs) of the waveform either one or two interpolated points having an amplitude equal to a predetermined amplitude that is typically a small fraction (usually 20% or less) of the maximum sampled amplitude. Whether one or two points are added depends on whether an existing sample point has an amplitude approximately equal to the predetermined amplitude.

Figure 5:
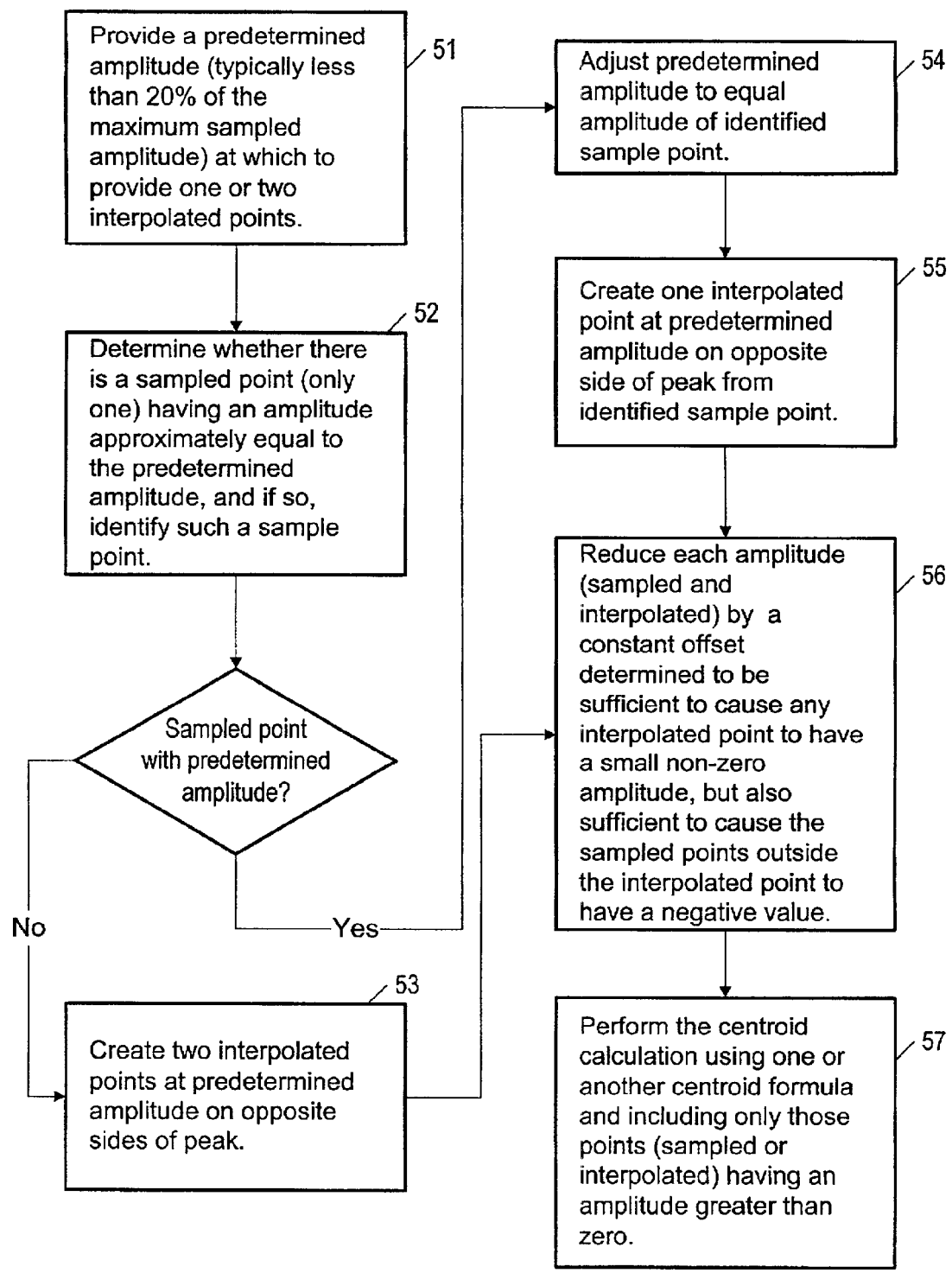
FIG. 5 is a flow chart of the method of the present invention.

Referring now to FIG. 5, the method begins with a step 51 of providing a predetermined amplitude at which one or two points are to be interpolated. Next, in a step 52, a search of the existing sample points is made to determine whether any such point has an amplitude approximately equal to the predetermined amplitude and if so to identify such a point.

Adding Only a Single Interpolated Point

Referring still to FIG. 5, if the sampled points include a point having an amplitude that is approximately equal to the predetermined amplitude, then only a single interpolated point is added to the set of points used in the centroid calculation. But first, in a step 54 (optional), the predetermined amplitude is adjusted to equal more precisely the amplitude of the identified existing sample point.

Figure 1:
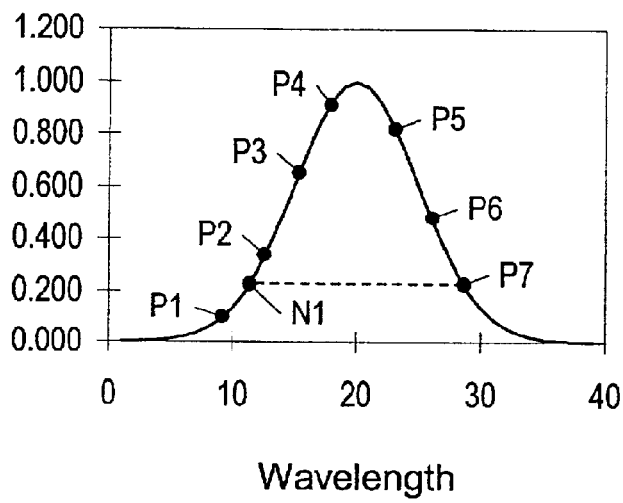
FIG. 1 is a graph of the sampled points of a waveform shown superimposed on a waveform that is sampled would yield the sampled points, and showing the addition of a new point to the set of sampled points.
Figure 2:
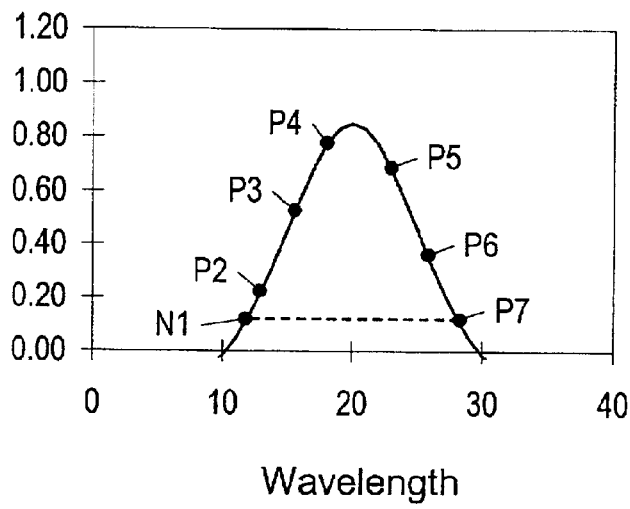
FIG. 2 is a graph of some of the sampled points of FIG. 1 and the added sampled point, with an amplitude of each sampled point reduced by an amount sufficient to eliminate the smallest amplitude sampled point of the original set of sampled points.

Referring now to FIGS. 1, 2 and still to FIG. 5, the method of the present invention in case of adding only a single interpolated point is shown as including the steps of: (in a step 55) creating the interpolated point N1, at a predetermined amplitude, to be used in combination with some of the sampled points P1, P2, ..., P7; (in a step 56) subtracting from each amplitude an offset (the same for each amplitude) sufficient to cause the interpolated point to have a small non-zero amplitude, but also sufficient to cause the sampled points outside the interpolated point (P1 in FIG. 1) to have a negative value (see FIG. 2); and (in a step 57) performing the centroid calculation using one or another centroid formula, such as that given by equation (1), i.e.

$$V_c = \frac{\sum_{i=1}^{n'} V_i A_i}{\sum_{i=1}^{n} A_i},$$

but including in the calculation only the originally sampled points having a positive amplitude after subtracting the predetermined constant offset, (i.e. points P2, ..., P7 of FIG. 1) as well as the interpolated point N1, as indicated in FIG. 2.

Another example of a formula that can be used to calculate the centroid, instead of that given by equation (1), is given by equation (5) below.

In a sense what is being done here is a reverse interpolation, in that the ordinate (amplitude) or y-value of the interpolated point is given (predetermined so as to have the interpolated point become an endpoint) and its abscissa (wavelength) or x-value is to be determined based on some method of interpolation, such as linear interpolation or cubic spline interpolation, or based on curve fitting using an assumed form of the equation for the waveform is known.

Still referring to FIGS. 1, 2 and 5, the interpolated point N1 is intended to even out (relative to the centroid) the distribution of wavelength-amplitude pairs used in the calculation of the centroid. Ideally, the resulting distribution is symmetric about the true centroid. In such a case, the calculation according to equation (1) will yield the actual centroid value, i.e. the wavelength at which the actual maximum of the waveform occurs.

Still referring to FIGS. 1, 2 and 5, according to the invention, the interpolated point that is added is to become an endpoint of the set of points used in the calculation of the centroid, as indicated in FIG. 2, and is therefore selected (in a step 51) to have a predetermined amplitude that is typically a small fraction (usually less than 20%) of the amplitude of the sampled point having the maximum amplitude (i.e. the amplitude of P4 in the case of the waveform of FIG. 1).

There is computational burden associated with adding an interpolated point. In some cases, as illustrated in FIG. 1, there is an existing sample point (P7) having an amplitude at or near the (predetermined) amplitude at which an interpolated point (N1) is to be added. In such a case, the predetermined amplitude is adjusted to equal the amplitude of the existing sampled point, and then only a single interpolation need be performed to add one point on the opposite side of the peak from the existing sampled point, and at the same amplitude as the existing sampled point. Then the offset is determined and subtracted from each sampled amplitude as well as from the amplitude of the interpolated point so that the interpolated point (N1) and the existing sample point (P7) become the endpoints of the waveform, with each having the same small, non-zero amplitude. Alternatively, the offset can be applied before the interpolation.

There is a significant saving of computational burden in only having to add a single interpolated point. The burden of adding one interpolated point, as illustrated in FIG. 1 where an existing sampled point is found to have approximately the predetermined amplitude, is approximately only one half that for adding two interpolated points, because it turns out to be possible to determine whether an existing sampled point has an amplitude approximately equal to the predetermined amplitude in as little as a single clock cycle.

Referring now in particular to FIG. 2, the same waveform is shown in FIG. 2 as in FIG. 1 except reduced in amplitude by the predetermined offset. The result is that point P1 has a negative amplitude and is therefore discarded (not used in the calculation of the centroid). The points used in the calculation of the centroid after subtracting the predetermined offset then include three points on either side of the maximum sampled amplitude P4.

Ideally an estimated background is also subtracted from each sampled amplitude, before subtracting the constant offset, the estimated background being in general different for different wavelength values. A subtraction of a constant offset from all sample points and also from the interpolated point has no effect on the calculation of the centroid, except that it drives some of the sampled amplitudes to a negative value (specifically the sampled amplitude for point P1 in FIG. 1), so that such points are not then used in the calculation of the centroid. On the other hand, the subtraction of a variable background can reduce skew.

Creating Two Interpolated Points

Figure 3:
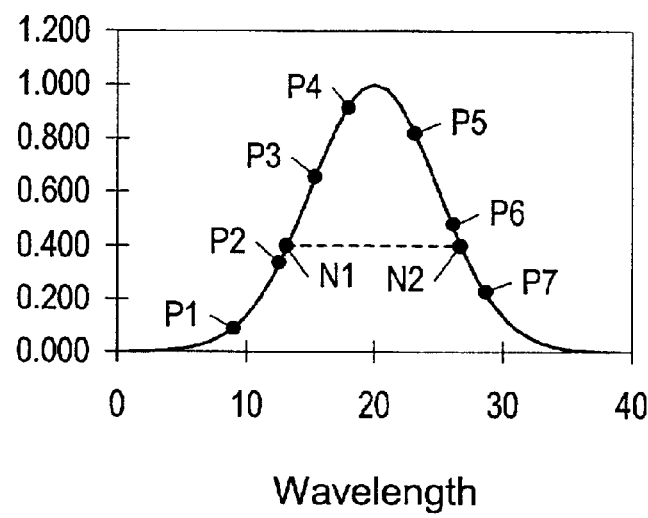
FIG. 3 is a graph of all of the original sampled points of FIG. 1, and showing the addition of two new points to be used in the calculation of the centroid of the waveform.

Referring now to FIG. 3 and FIG. 5, the method of the present invention is shown in case there is no existing sample point having an amplitude approximately equal to the predetermined amplitude so that two interpolated points are created. FIG. 3 shows the same waveform as in FIG. 1, with the same sampled points P1 P2 . . . P7, but indicates the addition in a step 53 of two interpolated points N1 N2 on either side of the maximum sampled amplitude P4. As explained above, the addition of two interpolated points involves nearly twice the computational burden as the addition of one interpolated point at an amplitude for which there is already a sampled point.

Figure 4:
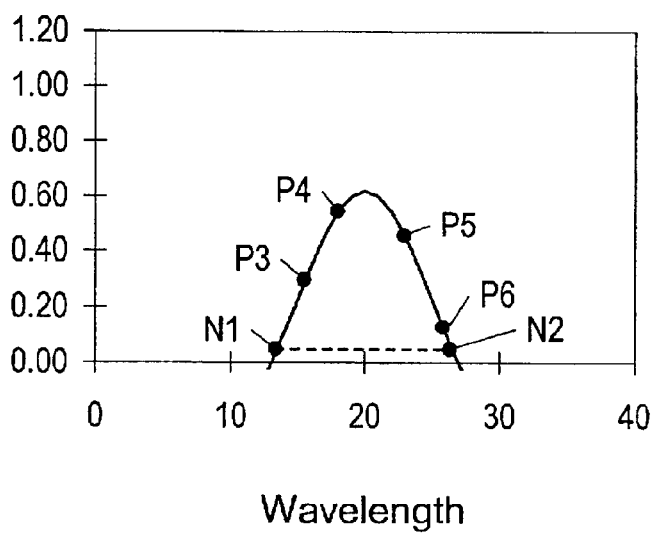
FIG. 4 is a graph of some of the sampled points of FIG. 3, as well as the points added to the original set of sampled points, with the amplitude of each of the sampled points and that of the added points reduced by an amount sufficient to eliminate use of several of the original sampled points in the calculation of the centroid of the waveform.

Referring now to FIG. 4, the waveform of FIG. 3 with the sampled points P3 . . . P6 inside the two interpolated points N1 N2 shows the reduction of amplitude (step 56) at each of the sampled points at an amount sufficient to eliminate all sample points outside of the two added interpolated points N1 N2.

Scope of the Invention

It is to be understood that the above-described arrangements are only illustrative of the application of the principles of the present invention. In particular, it is obvious that it is not actually necessary to subtract a predetermined offset from the amplitude of each of the sampled and interpolated points. It is enough to determine whether a given point has an amplitude greater than the offset and to include it in the calculation only in such a case, so that the offset serves as a predetermined threshold. Numerous other modifications and alternative arrangements may be devised by those skilled in the art without departing from the spirit and scope of the present invention, and the appended claims are intended to cover such modifications and arrangements.

What is claimed is:

1. A method for determining the centroid ($V_c$) of a waveform signal indicating how a system responds to an input signal as the value of the input signal is varied over a predetermined range, the waveform being sampled at a set of parameter values ($V_i$, i=1, . . . , n) yielding a corresponding set of sampled amplitudes ($A_i$, i=1, . . . , n), each parameter value and corresponding amplitude forming a sampled point ($V_i$, $A_i$), comprising the steps of:

a) selecting an amplitude at which to create an interpolated point;

b) interpolating a first parameter value corresponding to the amplitude selected in step (a); and c) performing a centroid calculation using only the sampled points with an amplitude greater than a predetermined threshold.

2. The method of claim 1 wherein the amplitude selected in step (a) is less than approximately twenty percent of the maximum sampled amplitude.

3. The method of claim 1 wherein the centroid $V_c$ is calculated using as a formula:

$$V_c = \frac{\sum_{i=1}^{n} V_i A_i}{\sum_{i=1}^{n} A_i},$$

in which $A_i$ is an amplitude of the waveform and $V_i$ is a corresponding physical parameter on which the amplitude of the waveform depends.

4. The method of claim 1, wherein the waveform is sampled in the presence of background noise, and the method further comprises the steps of:

d) estimating the background ($B_i$) for each value in the set of parameter values at which sampling is performed; and e) reducing the amplitude ($A_i$) of each sampled amplitude by the background ($B_i$) so estimated.

5. The method of claim 1, wherein among the sampled amplitudes there is a maximum sampled amplitude, and wherein the method further comprises the step of interpolating a second parameter value to correspond to the amplitude selected in step (a), the second value on the opposite side from the first interpolated value of the maximum sampled amplitude.

6. An apparatus for determining the centroid ($V_c$) of a waveform signal indicating how a system responds to an input signal as the value of the input signal is varied over a predetermined range, the waveform being sampled at a set of parameter values ($V_i$, i=1, . . . , n) yielding a corresponding set of sampled amplitudes ($A_i$, i=1, . . . , n), each parameter value and corresponding amplitude forming a sampled point ($V_i$, $A_i$), the apparatus comprising:

a) means for selecting an amplitude at which to create an interpolated point;

b) means for interpolating a first parameter value corresponding to the selected amplitude; and c) means for performing a centroid calculation using only the sampled points with an amplitude greater than a predetermined threshold.

7. The apparatus of claim 6, wherein the selected amplitude is less than approximately twenty percent of the maximum sampled amplitude.

8. The apparatus of claim 6, wherein the centroid ($V_i$) is calculated using as a formula:

$$V_c = \frac{\sum_{i=1}^{n} V_i A_i}{\sum_{i=1}^{n} A_i},$$

in which $A_i$ is an amplitude of the waveform and $V_i$ is a corresponding physical parameter on which the amplitude of the waveform depends.

9. The apparatus of claim 6, wherein the waveform is sampled in the presence of background noise, and the apparatus further comprises:

d) means for estimating the background ($B_i$) for each value in the set of parameter values at which sampling is performed; and f) means for reducing the amplitude ($A_i$) of each sampled amplitude by the background ($B_i$) so estimated.

10. The apparatus of claim 6, wherein among the sampled amplitudes there is a maximum sampled amplitude, and the apparatus further comprises means for interpolating a second parameter value to correspond to the selected amplitude, the second value on the opposite side from the first interpolated value of the maximum sampled amplitude.

* * * * *

UNITED STATES PATENT AND TRADEMARK OFFICE
CERTIFICATE OF CORRECTION

PATENT NO. : 6,804,693 B2
DATED : October 12, 2004
INVENTOR(S) : David G. Bellemore et al.

It is certified that error appears in the above-identified patent and that said Letters Patent is hereby corrected as shown below:

Column 6,
Line 56, delete "($V_i$)" and substitute -- ($V_c$) --.

Signed and Sealed this

Third Day of May, 2005

JON W. DUDAS
*Director of the United States Patent and Trademark Office*